(12) United States Patent
Zhang

(10) Patent No.: US 11,244,709 B2
(45) Date of Patent: Feb. 8, 2022

(54) WRITE OPERATION CIRCUIT, SEMICONDUCTOR MEMORY, AND WRITE OPERATION METHOD

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/313,003

(22) Filed: May 6, 2021

(65) Prior Publication Data

US 2021/0257011 A1 Aug. 19, 2021

Related U.S. Application Data

(63) Continuation of application No. PCT/CN2020/097336, filed on Jun. 22, 2020.

(30) Foreign Application Priority Data

Oct. 25, 2019 (CN) .......................... 201911021470.5

(51) Int. Cl.
*G11C 7/10* (2006.01)

(52) U.S. Cl.
CPC .......... *G11C 7/1039* (2013.01); *G11C 7/1048* (2013.01); *G11C 7/1057* (2013.01); *G11C 7/1063* (2013.01); *G11C 7/1084* (2013.01)

(58) Field of Classification Search
CPC .......................................... G11C 7/1039
USPC ...................................... 365/189.05
See application file for complete search history.

(56) References Cited

U.S. PATENT DOCUMENTS

| | | | | |
|---|---|---|---|---|
| 5,999,434 A | * | 12/1999 | Yoneda | G06F 7/74 365/49.18 |
| 6,172,935 B1 | * | 1/2001 | Wright | G11C 7/1072 365/194 |
| 2006/0218455 A1 | | 9/2006 | LeClair et al. | |
| 2008/0074936 A1 | * | 3/2008 | Kim | G11C 8/16 365/189.15 |

(Continued)

FOREIGN PATENT DOCUMENTS

| | | |
|---|---|---|
| CN | 101149963 A | 3/2008 |
| CN | 203799670 U | 8/2014 |
| CN | 211125039 U | 7/2020 |

*Primary Examiner* — Muna A Techane
(74) *Attorney, Agent, or Firm* — Kilpatrick Townsend & Stockton LLP

(57) ABSTRACT

Embodiments provide a write operation circuit, a semiconductor memory, and write operation method. The write operation circuit includes: a data determination module that determines whether to flip an input data of the semiconductor memory depending on the number of high data bits in the input data so as to generate a flip flag data and a first intermediate data; a data buffer module that determines whether to flip a global bus according to a second intermediate data, where the second intermediate data is an inverted data of the first intermediate data; a data receiving module that decodes the global bus data according to the flip flag data and writes the decoded data into a memory bank of the semiconductor, where the decoding including determining whether to flip the global bus data; and a precharge module that sets the initial state of the global bus to low.

12 Claims, 4 Drawing Sheets

(56) References Cited

U.S. PATENT DOCUMENTS

2013/0088919 A1* 4/2013 Kim .................. G11C 16/3459
365/185.12

* cited by examiner

WRITE OPERATION CIRCUIT, SEMICONDUCTOR MEMORY, AND WRITE OPERATION METHOD

CROSS REFERENCE

This application is a continuation of PCT/CN2020/097336, filed on Jun. 22, 2020, which claims the priority to and benefit of Chinese patent application number 201911021470.5, entitled "Write Operation Circuit, Semiconductor Memory, and Write Operation Method", and filed on Oct. 25, 2019 with China National Intellectual Property Administration, the entire contents of which are incorporated herein by reference in its entirety.

TECHNICAL FIELD

This application relates to the technical field of semiconductor memories, and in particular to a write operation circuit, a semiconductor memory, and a write operation method.

BACKGROUND

This section is intended to provide background or context for the embodiments of the application defined in the appended claims.

Semiconductor memories include static random access memory (SRAM), dynamic random access memory (DRAM), synchronous dynamic random access memory (SDRAM), Read-Only Memory (ROM), flash memory, and so on.

In the DRAM protocol of the Joint Electron Device Engineering Council (JEDEC), there are specific speed and power saving requirements for DRAM. It therefore has become an urgent problem to be solved as to make DRAM more power-saving while also ensuring signal integrity and reliability of data transfer and storage.

SUMMARY

Embodiments of the present application provide a write operation circuit, a semiconductor memory, and a write operation method to solve or alleviate one or more technical problems in the prior art.

In a first aspect, an embodiment of the present application provides a write operation circuit applied to a semiconductor memory, the write operation circuit comprising:

a data determination module configured to determine whether to flip an input data based on the number of high data bits in the input data of the semiconductor memory, so as to generate a flip flag data and a first intermediate data;

a data buffer module, comprising a plurality of PMOS transistors and a plurality of first inverters, wherein a gate of each of the plurality of PMOS transistor is coupled to the data determination module through the first inverter for receiving a second intermediate data, and a drain of the PMOS transistor is coupled to a global Bus, wherein the data buffer module is configured to determine whether to flip the global bus according to the second intermediate data, and the second intermediate data is an inverted data of the first intermediate data;

a data receiving module coupled to a memory bank, wherein the data receiving module is configured to receive a global bus data on the global bus, receive the flip flag data through the flip flag signal line, decode the global bus data according to the flip flag data, and write the decoded data into the memory bank of the semiconductor memory, wherein the decoding comprises determining whether to flip the global bus data; and a precharge module, coupled to a precharge signal line and configured to set the initial state of the global bus to low.

In one embodiment, there is further included a serial-to-parallel conversion circuit coupled between Data Queue (DQ) port of the semiconductor memory and the data determination module, and configured to perform serial-to-parallel conversion on the first input data of the DQ port to generate a second input data, wherein the data determination module is configured for determining whether to flip the second input data depending on a number of high data bits in the second input data to generate the flip flag data and the first intermediate data.

In one embodiment, the second input data is divided into a number of M sets, the flip flag data comprises a number of M bits, and the M-bit flip flag data has an one-to-one correspondence relationship with the M sets of second input data. Each set of second input data comprises a number of N bits, and M and N are integers greater than 1. In the case where the number of high data bits in one input set of second input data is greater than N/2, the data determination module is configured for outputting a flipped data of the set of second input data as a corresponding set of first intermediate data, and setting the data bit in the flip flag data corresponding to the set of second input data to high. In the case where the number of high data bits in one input set of second input data is less than or equal to N/2, the data determination module is configured for outputting the set of second input data as the corresponding set of first intermediate data, and setting the data bit in the flip flag data corresponding to the set of second input data to low.

In one embodiment, the data determination module comprises:

a data determination unit, comprising an input end of the data determination unit is coupled to the serial-to-parallel conversion circuit, the output end of the data determination unit is coupled to the flip flag signal line, wherein the data determination unit is configured for setting the flip flag data to high in the case where the number of high data bits in the second input data is greater than a preset value, and setting the flip flag data to low in the case where the number of high data bits in the second input data is less than or equal to the preset value; and a data selector, comprising an input end coupled to the data determination unit for receiving the second input data through the data determination unit and receiving the flip flag data through the flip flag signal line, and an output end coupled to an input end of a first inverter, wherein the data selector is configured for outputting the flipped data of the second input data as the first intermediate data when the flip flag data is high, and outputting the original second input data as the first intermediate data when the flip flag data is low.

In an embodiment, the data selector comprises a plurality of data selection units, the data selection unit comprising:

a second inverter, comprising an input end configured to receive the flip flag data through the flip flag signal line;

a third inverter, comprising an input end coupled to the data determination unit for receiving the second input data from the data determination unit;

a first transmission gate, comprising an input end coupled to the output end of the third inverter, and the output end of the first transmission gate is coupled to the input end of the first inverter, the first transmission gate being configured for outputting the first intermediate data, wherein the inverted control end of the first transmission gate is coupled to the output end of the second inverter, and the positive control end of the first transmission gate receives the flip flag data through the flip flag signal line;

a second transmission gate, comprising an input end of the second transmission gate is coupled to the data determination unit for receiving the second input data from the data determination unit, and the output end of the second transmission gate is coupled to the input end of the first inverter for outputting the first intermediate data, the inverted control end of the second transmission gate receives the flip flag data through the flip flag signal line, and the positive control end of the second transmission gate is coupled to the output end of the second inverter.

In one embodiment, the global bus data comprises M sets of global bus data, and the M-bit flip flag data corresponds to the M sets of global bus data in one-to-one correspondence. The data receiving module comprises a number of M data receiving units coupled to the memory banks, wherein the data receiving unit is used to decode the global bus data of the corresponding set according to the one-bit flip flag data.

In one embodiment, the data receiving unit comprises:

a fourth inverter, comprising an input end configured to receive the flip flag data through the flip flag signal line;

a fifth inverter, comprising an input end configured to receive the global bus data through the global bus;

a third transmission gate, comprising an input end coupled to an output end of the fifth inverter, an output end of the third transmission gate is coupled to the memory bank, the third transmission gate being configured for outputting the decoded data to the memory bank, where the inverted control end of the third transmission gate is coupled to the output end of the fourth inverter, and the positive control end of the third transmission gate receives the flip flag data through the flip flag signal line;

a fourth transmission gate, where the input end of the fourth transmission gate receives the global bus data through the global bus, the output end of the fourth transmission gate is coupled to the memory bank, the fourth transmission gate being used to output the decoded data to the memory bank, where the inverted control end of the fourth transmission gate receives the flip flag data through the flip flag signal line, and the positive control end of the fourth transmission gate is coupled to the output end of the fourth inverter.

In one embodiment, the precharge module comprises a plurality of NMOS transistors and a plurality of hold circuits, where the gate of the NMOS transistor is coupled to a precharge signal line, the drain of the NMOS transistor is coupled to the global bus, and the input and output ends of the hold circuit are coupled to the global bus.

In a second aspect, an embodiment of the present application provides a semiconductor memory comprising the write operation circuit according to any of the foregoing embodiments.

In a third aspect, an embodiment of the present application provides a write operation method applied to a semiconductor memory, the write operation method comprising:

setting an initial state of a global bus to low;

determining whether to flip an input data based on the number of high data bits in the input data of the semiconductor memory, so as to generate a flip flag data and a first intermediate data;

determining whether to flip the global bus according to the second intermediate data, where the second intermediate data is an inverted data of the first intermediate data; and decoding a global bus data according to the flip flag data, wherein the decoding comprises determining whether to flip the global bus data; and writing the decoded data into the memory bank.

In one embodiment, the operation of determining whether to flip an input data based on the number of high data bits in the input data of the semiconductor memory, so as to generate a flip flag data and a first intermediate data comprises:

performing serial-to-parallel conversion on the first input data of the DQ port to generate a second input data;

determining whether to flip the second input data based on the number of high data bits in the second input data so as to generate the flip flag data and the first intermediate data;

In one embodiment, the operation of determining whether to flip the second input data based on the number of high data bits in the second input data so as to generate the flip flag data and the first intermediate data comprises:

dividing the second input data into M sets, each set of second input data has N bits, where M and N are integers greater than 1;

in the case where the number of high data bits in a set of second input data is greater than N/2, outputting an inverted data of the set of second input data as the corresponding set of first intermediate data, and setting the data bit in the flip flag data corresponding to the set of second input data to high; and in the case where the number of high data bits in a set of second input data is less than or equal to N/2, outputting the set of second input data as the corresponding set of first intermediate data, and setting the data bit in the flip flag data corresponding to the set of second input data to low; and By adopting the foregoing technical solutions, embodiments of the present application can reduce the number of flips on the global bus under the precharge pull-down architecture, thereby greatly compressing the current and reducing the power consumption.

The above overview is intended for mere illustrative purposes and is not intended to be limiting in any means. In addition to the illustrative aspects, embodiments, and features described above, further aspects, embodiments, and features of the present application will be easily understood by referring to the accompanying drawings and the following detailed description.

BRIEF DESCRIPTION OF THE DRAWINGS

In the drawings, unless otherwise specified, the same reference numerals refer to the same or similar parts or elements throughout the multiple drawings. These drawings are not necessarily drawn to scale. It should be understood that these drawings only depict some embodiments according to the present application, and should not be regarded as limiting the scope of the present application.

DESCRIPTION OF REFERENCE SIGNS

Figure 1:
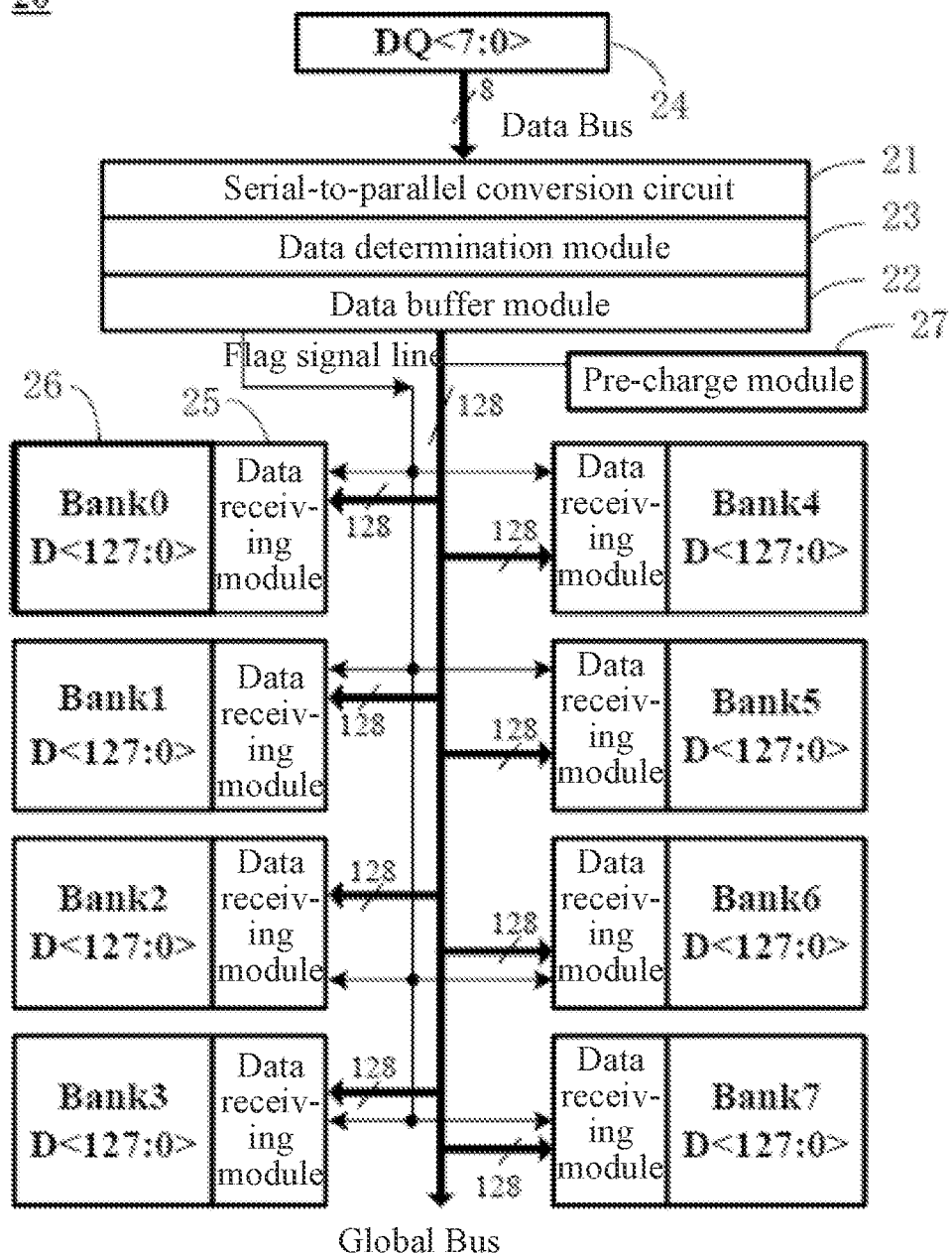
FIG. 1 schematically shows a block diagram of a part of the structure of a semiconductor memory according to an embodiment of the present application.

20: Semiconductor memory;
21: Serial-to-parallel conversion circuit;
22: Data buffer module;
23: Data determination module;
24: DQ port;
25: Data receiving module;
26: Memory bank;
221: PMOS transistor;
222: NMOS transistor;
223: Hold circuit;
224: First inverter;
231: Data determination unit;
232: Data selector;
232': Data selection unit;
232A: Second inverter;
232B: Third inverter;
232C: First transmission gate;
232D: Second transmission gate;
250: Data receiving unit;
251: Fourth inverter;
252: Fifth inverter;
253: Third transmission gate;
254: Fourth transmission gate.

DETAILED DESCRIPTION OF EMBODIMENTS

Illustrative embodiments will now be described more fully below in connection with the accompanying drawings. However, these illustrative embodiments may be able to be practiced in a variety of forms, and therefore should not be construed as being limited to the embodiments set forth herein. On the contrary, these embodiments are provided so that this application will become comprehensive and complete, and will be able to fully convey the concept of these illustrative embodiments to those having ordinary skill in the art. In these drawings, same reference numerals denote the same or similar parts, and thus they will not be repeatedly detailed.

FIG. 1 schematically shows a block diagram of a part of the structure of a semiconductor memory according to an embodiment of the present application. As shown in FIG. 1, the semiconductor memory 20 includes a DQ port 24, a memory bank (bank) 26, and a write operation circuit. The write operation circuit includes a global bus (Global Bus), a flip flag (identification) signal line, a serial-to-parallel conversion circuit 21, a data determination module 23, a data buffer module (Data Bus Buffer) 22, a data receiving module 25, and a precharge module 27. In one embodiment, the semiconductor memory 20 is a DRAM, such as a fourth-generation double-rate synchronous dynamic random access memory (Double Data Rate SDRAM 4, DDR4 for short).

In an example, as shown in FIG. 1, a 8-bit first input data DQ<7:0> may be input from the DQ port 24, so that the data to be written (namely the decoded data) D<127:0> would be written into the memory bank 26 through the write operation circuit.

One Active command turns on the only one designated memory bank 26, and the write operation can only be performed on one memory bank 26. In other words, when one of the memory banks 26 (i.e. Bank<7:0>) is operating, the other Banks are not working. It should be noted, however, that the number of memory banks 26, the number of data bits of each memory bank 26, and the number and the number of data bits of the DQ ports 24 will not be limited in this embodiment. For example, there may be one DQ port 24, which is used to input a 8-bit first input data; there may also be two DQ ports 24, that is, each DQ port 24 is used to input a 8-bit first input data DQ<7:0> or DQ<15:8>, thus inputting a in effect a 16-bit first input data DQ<15:0>.

Figure 2:
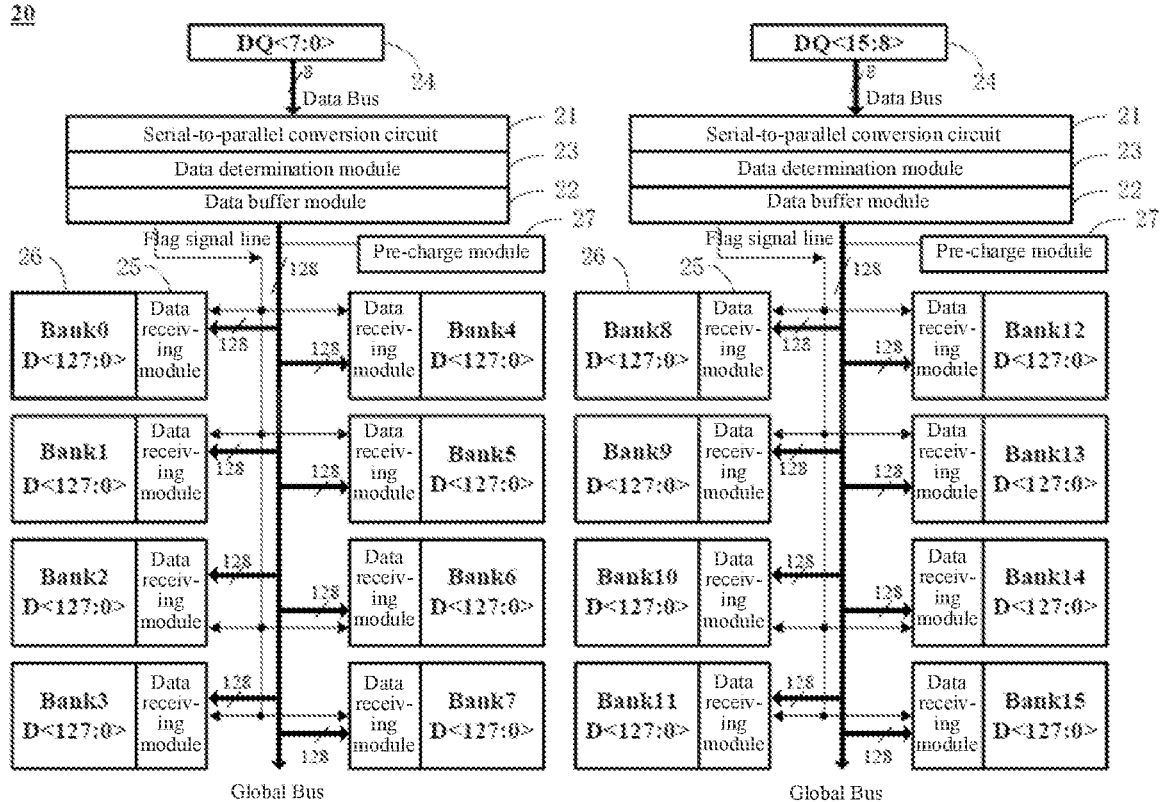
FIG. 2 schematically shows a block diagram of a part of the structure of a semiconductor memory according to another embodiment of the present application.

For example, as shown in FIG. 2, the first input data DQ<7:0> may perform a write operation on a set of memory banks Bank<7:0> through the above-mentioned write operation circuit; the first input data DQ<15:8> may perform a write operation on another set of memory banks Bank<15:8> through the above-mentioned another write operation circuit. Accordingly, among the eight memory banks 26 corresponding to DQ<15:8> (i.e. Bank<15:8>), when only one bank works, the other banks do not work.

The semiconductor memory 20 may have an array structure, and different units may have the same structure. However, because the input data may be different, the output data of different units may be different. The following takes one memory bank as an example to introduce the write operation circuit of this embodiment.

As shown in FIGS. 1 and 2, the write operation circuit of this embodiment includes a data determination module 23, which is used to determine whether to flip the input data according to the number of high data bits in the input data of the semiconductor memory 20 so as to generate a flip flag data and a first intermediate data.

In one embodiment, the data determination module 23 is configured to output the inverted data of the input data as the first intermediate data in the case where the number of high data bits in the input data is greater than the preset value, and set the Flag data to high, and output the original input data as the first intermediate data in the case where the number of high data bits in the input data is less than or equal to the preset value, and further set the Flag data to low.

For example, the input data has 8 bits. If the number of bits equal to "1" in the input data is more than half, that is, more than 4 bits (e.g., 5 bits), then Flag=1, and the first intermediate data output will be equal to the flipped data of the input data. Otherwise if the number of bits equal to "1" in the written data is less than half, e.g., if the data bits equal to "1" have 3 bits, then Flag=0, and the output first intermediate data will be equal to the original input data.

As meant herein, a "high" data bit may mean a data bit that is a equal to "1", while a "low" data bit may be a data bit that is equal to "0". Data flipping can be understood as changing from "0" to "1", or from "1" to "0". The flipping of the data line or the signal line may be understood as changing a high level to a low level, or changing a low level to a high level.

In one embodiment, the write operation circuit includes a serial-to-parallel conversion circuit 21. The serial-to-parallel conversion circuit 21 is coupled between the DQ port 24 and the data determination module 23, and is used to perform serial-to-parallel conversion on the first input data of the DQ port 24 so as to generate a second input data. For example, the serial-to-parallel conversion circuit 21 may perform serial-to-parallel conversion on the 8-bit first input data DQ<7:0>, thus generating a 128-bit second input data D2'<127:0> corresponding to Bank0.

In one embodiment, the second input data D2'<127:0> is divided into M sets, the Flag data has M bits, which has one-to-one correspondence relationship with the M sets of second input data, and each set of second input data has N bits, where M and N are integers greater than 1. In the case where the number of high data bits in one input set of second input data is greater than N/2, the data determination module 23 is used for outputting the flipped data of the set of second input data as the corresponding set of first intermediate data, and setting the data bit in the flip flag data corresponding to the set of second input data to high. In the case where the number of high data bits in one input set of second input data is less than or equal to N/2, the data determination module is used for outputting the set of second input data as the corresponding set of first intermediate data, and setting the data bit in the flip flag data corresponding to the set of second input data to low.

For example, the second input data D2'<127:0> may be divided into 16 sets, where each set of second input data has 8 bits, and each set of second input data corresponds to one bit of the Flag data. Correspondingly, the Flag data has 16 bits, such as Flag<15:0>. The first intermediate data D1'<127:0> will be divided into 16 sets accordingly. Each bit of Flag data corresponds to a set of first intermediate data. For a set of second input data D2'<127:120>, if the number of digits equal to "1" in D2'<127:120> is greater than 4 bits, then the corresponding Flag<15>=1, the set of first intermediate data D1'<120:127> that is output is equal to the flipped data of D2'<127:120>. If the number of bits equal to "1" in the second input data is less than or equal to 4 bits, then the corresponding Flag<15>=0, and the set of first intermediate data D1'<120:127> that is output is just D2'<127:120>. Similarly, for a set of second input data D2'<15:8>, if the number of bits equal to "1" in D2'<15:8> is greater than 4, then the corresponding Flag<1>=1, the set of first intermediate data D1'<15:8> that is output is equal to the flipped data of D2'<15:8>. Otherwise if the number of bits equal to "1" in the second input data is less than or equal to 4 bits, then the corresponding Flag<1>=0, and the output set of first intermediate data D1'<15:8> is just D2'<15:8>. For a set of second input data D2'<7:0>, if the number of bits equal to "1" in D2'<7:0> is greater than 4, then the corresponding Flag<0>=1, the output set of first intermediate data D1'<7:0> is equal to the flipped data of D2'<7:0>. Otherwise if the number of bits equal to "1" in the second input data is less than or equal to 4 bits, then the corresponding Flag<0>=0, and the output set of first intermediate data D1'<7:0> will just be D2'<7:0>. Therefore, in the first intermediate data D1'<127:0>, there are relatively more data bits that are "0".

Figure 3:
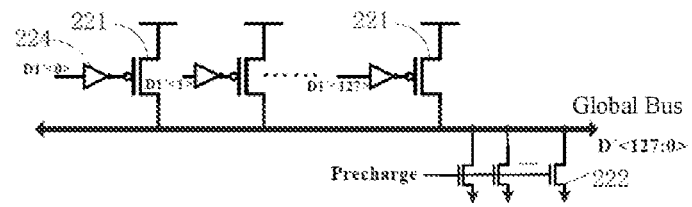
FIG. 3 schematically shows a circuit diagram (corresponding to one memory bank) of a data buffer module and a precharge module according to an embodiment of the present application.
Figure 4:
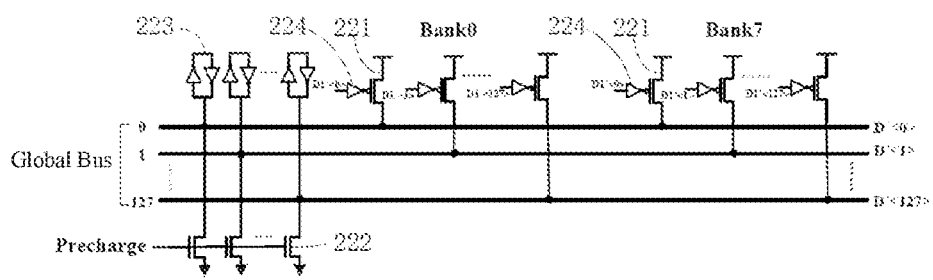
FIG. 4 schematically shows a circuit diagram (corresponding to multiple memory banks) of a data buffer module and a precharge module according to an embodiment of the present application.

Further, the semiconductor memory 20 of this embodiment may further include a data buffer module 22 and a precharge module 27. FIG. 3 schematically shows a circuit diagram (corresponding to one memory bank 26) of a data buffer module 22 according to an embodiment of the present application. FIG. 4 schematically shows a circuit diagram (corresponding to 8 memory banks 26) of a data buffer module 22 according to an embodiment of the present application.

As shown in FIGS. 3 and 4, the data buffer module 22 includes a plurality of PMOS (Positive Channel Metal Oxide Semiconductor) transistors 221 and a plurality of first inverters 224. The gate of the PMOS transistor 221 is coupled to the data determination module 23 through the first inverter 224, and the drain of the PMOS transistor 221 is coupled to the global bus. The first inverter 224 is used to perform an inversion operation on the first intermediate data to generate the second intermediate data, so that the data buffer module 22 may further determine whether to flip the global bus according to the second intermediate data. Since there are relatively more data bits of "0" in the first intermediate data, there are relatively more data bits of "1" in the second intermediate data.

The precharge module 27 is coupled to the precharge signal line (Precharge), and is used to set the initial state of the global bus to low. That is to say, in this embodiment, the semiconductor memory 20 adopts a precharge pull-down (Low) global bus transfer structure. In particular, the precharge module 27 may include a plurality of NMOS (Negative Channel Metal Oxide Semiconductor) transistors 222 and a plurality of hold circuits 223. The gate of the NMOS transistor 222 is coupled to the precharge signal line, and the drain of the NMOS transistor 222 is coupled to the global bus. The input and output ends of the hold circuit 223 are coupled to the global bus, thereby forming a positive feedback circuit.

The Precharge serves the function of setting the initial state of each global bus to low. The specific process may include generating a pull-down pulse (pulse, lasting about 2 ns) by the Precharge signal, thus pulling down the corresponding global bus for a while. The hold circuit 223 then forms a positive feedback and locks the global bus at low level, but the ability of the hold circuit 223 to pull up and pull down current is relatively weak. When a global bus needs to change to a high level, the data line corresponding to the global bus (that is, the data line coupled to the gate of the PMOS transistor 221 corresponding to this global bus) may be pulled down for a bit (also a pulse, lasting about 2 ns), so that the corresponding PMOS transistor 221 will pull up the global bus for a while (the pull-up capability is greater than the pull-down capability of the hold circuit 223). Then the global bus will be locked to a high level through positive feedback to complete the flipping action of the data line. Since there are more data bits "0" in the second intermediate data, relatively fewer flipping actions are required. Therefore, the IDD4W (write current) of the semiconductor memory will be reduced, thereby reducing the power consumption of the semiconductor memory.

In an example, there are multiple global buses, which are divided into M (M is an integer greater than 1) sets, and each global bus transfers one bit of the global bus data. For example, there may be 128 global buses, where global bus<0> transfers global bus data D'<0>, global bus<1> transfers global bus data D'<1>; ..., global bus<127> transfers global bus data D'<127>. The 128 global buses are divided into 16 sets.

In one example, each bit of Flag data corresponds to a set of global bus data. Correspondingly, there are 16 Flag signal lines, and the Flag data has 16 bits, such as Flag<15:0>. Each Flag signal line may transfer 1 bit of Flag data. For example, Flag signal line <0> transfers Flag data Flag<0>, and corresponds to the global bus data D'<0:7>, indicating whether D'<0:7> is the flipped data of the second intermediate data. The Flag signal line <1> transfers Flag data Flag<1>, and corresponds to the global bus data D'<8:15>, indicating whether D'<8:15> is the flipped data of the second intermediate data, and so on and so forth . . . , until the Flag signal line <15> transfers Flag data Flag<15>, and corresponds to the global bus data D'<120:127>, indicating whether D'<120:127> is the flipped data of the second intermediate data.

Since the second intermediate data is the inverted data of the first intermediate data D1'<120:127>, when Flag<15>=1, the global bus data D'<127:120>=D1'<127:120>. When Flag<15>=0, the global bus data D'<127:120> is the flipped data of D1'<127:120>. Similarly, when Flag<1>=1, D'<15:8>=D1'<15:8>; when Flag<1>=0, D'<15:8> is the flipped data of D1'<15:8>. When Flag<0>=1, D'<7:0>=D1'<7:0>; when Flag<0>=0, D'<7:0> is the flipped data of D1'<7:0>.

Therefore, in the global bus data D'<127:0> transferred on the global bus, there are more data bits that are "0". Accordingly, in the semiconductor memory 20 shown in FIG. 2, the 256-bit global bus data (including the 128-bit global bus data corresponding to DQ<7:0> and the 128-bit global bus data corresponding to DQ<15:8>), there are relatively more data bits of "0".

Figure 5:
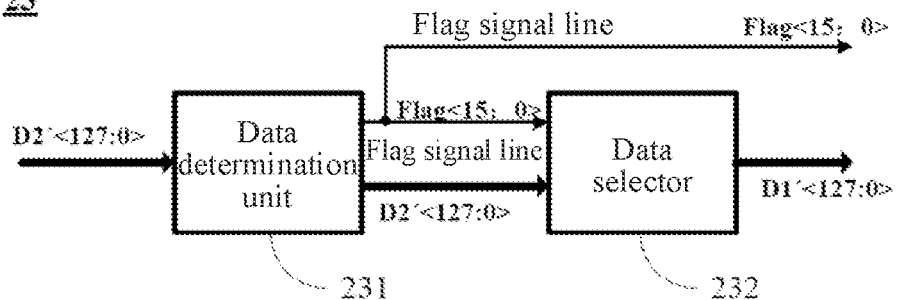
FIG. 5 schematically shows a block diagram of a data determination module according to an embodiment of the present application.

In one embodiment, as shown in FIG. 5, the data determination module 230 includes a data determination unit 231 and a data selector 232.

The input end of the data determination unit 231 is coupled to the serial-to-parallel conversion circuit 21, and the output end of the data determination unit 231 is coupled to the Flag signal line, and is further coupled to the input end of the data selector 232. The data determination unit 231 is configured to set the Flag data to high in the case where the number of high data bits in the second input data is greater than the preset value, and set the Flag data to low in the case where the number of high data bits in the second input data is less than or equal to the preset value.

The input end of the data selector 232 is coupled to the data determination unit 231 for receiving the second input data through the data determination unit 231. The input end of the data selector 232 also receives the Flag data through the Flag signal line, and the output end of the data selector 232 is coupled to the input end of the first inverter 224. The data selector 232 is used to output the flipped data of the second input data as the first intermediate data in the case where the Flag data is high, and use the original second input data as the first intermediate data in the case where the Flag data is high.

In one embodiment, the data selector 232 includes a plurality of data selection units 232', where each data selection unit 232' is used to process one bit of Flag data and a set of second input data. For example, there may be 16 data selection units 232', corresponding to respective 16 sets of second input data and one bit of Flag data.

Figure 6:
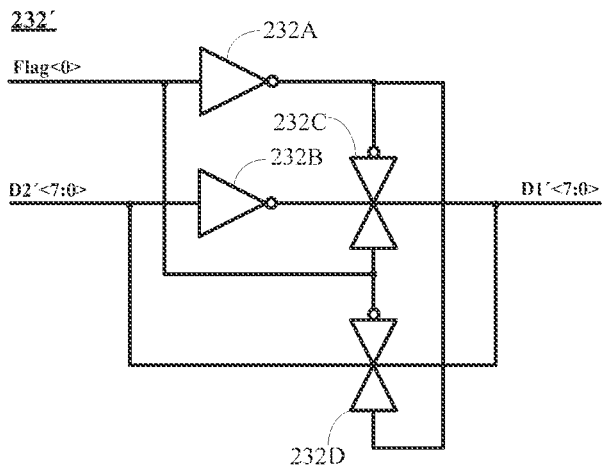
FIG. 6 schematically shows a block diagram of a data selection unit according to an embodiment of the present application.

FIG. 6 shows an implementation of the data selection unit 232'. As shown in FIG. 6, the data selection unit 232' includes a second inverter 232A, a third inverter 232B, a first transmission gate 232C, and a second transmission gate 232D.

The input end of the second inverter 232A receives Flag data through the Flag signal line. The input end of the third inverter 232B is coupled to the data determination unit 231 for receiving the second input data from the data determination unit 231. The input end of the first transmission gate 232C is coupled to the output end of the third inverter 232B. The output end of the first transmission gate 232C is coupled to the input end of the first inverter 224 for outputting the first intermediate data. The inverted control end of the first transmission gate 232C (the upper control end shown in FIG. 6) is coupled to the output end of the second inverter 232A. The positive control end of the first transmission gate 232C (the lower control end shown in FIG. 6) receives the Flag data through the Flag signal line. The input end of the second transmission gate 232D is coupled to the data determination unit 231 for receiving the second input data from the data determination unit 231. The output end of the second transmission gate 232D is coupled to the input end of the first inverter 224 for outputting the first intermediate data. The inverted control end of the second transmission gate 232D receives the Flag data through the Flag signal line. The positive control end of the second transmission gate 232D is coupled to the output end of the second inverter 232A.

Take Flag<0> and the second input data D2'<7:0> as an example, as shown in FIG. 6, when Flag=1, the first intermediate data D1'<7:0> is the flipped data of second input data D2'<7:0>. Otherwise when Flag=0, the first intermediate data D1'<7:0> is just the second input data D2'<7:0>.

It should be noted that one set of the third inverter 232B, first transmission gate 232C, and second transmission gate 232D are used to process one bit of the second input data and output one bit of the corresponding first intermediate data. In other words, corresponding to the 8-bit second input data D2'<7:0>, there should also be 8 sets of the third inverter 232B, the first transmission gate 232C, and the second transmission gate 232D, thus outputting the 8-bit first intermediate data D1'<7:0>.

Thus, when the Flag data is 1, the global bus data D'<127:0> is the flipped data of the second input data D2'<127:0>. When the Flag data is 0, the global bus data D'<127:0> is the original second input data D2'<127:0>.

Figure 7:
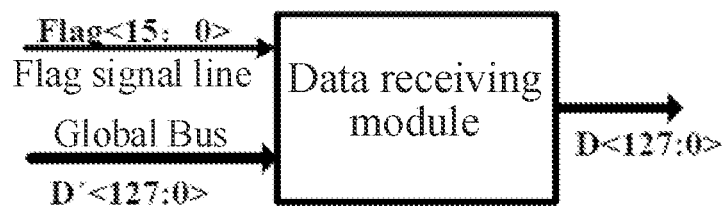
FIG. 7 schematically shows a block diagram of a data receiving module according to an embodiment of the present application.

As shown in FIGS. 1, 2 and 7, the write operation circuit in this embodiment further includes a data receiving module 25. The input end of the data receiving module 25 is coupled to the global bus and to the flip flag signal line. The output end of the data receiving module 25 is coupled to the memory bank 26. The data receiving module 25 is used to determine whether to flip the global bus data (decoding the global bus data) according to the Flag data, and write the decoded data (write data) into the memory bank 26. For example, in the case where the Flag data is high, the flipped data of the global bus data may be output as the data to be written; and when the Flag data is low, the original global bus data may be output as the data to be written.

As a result, the written data is restored to the input data of the semiconductor memory. Accordingly, the data and functions of the external ports of the semiconductor memory 20, such as the DQ port 24 and the DBI port (not shown in the figures), will not be changed.

Figure 8:
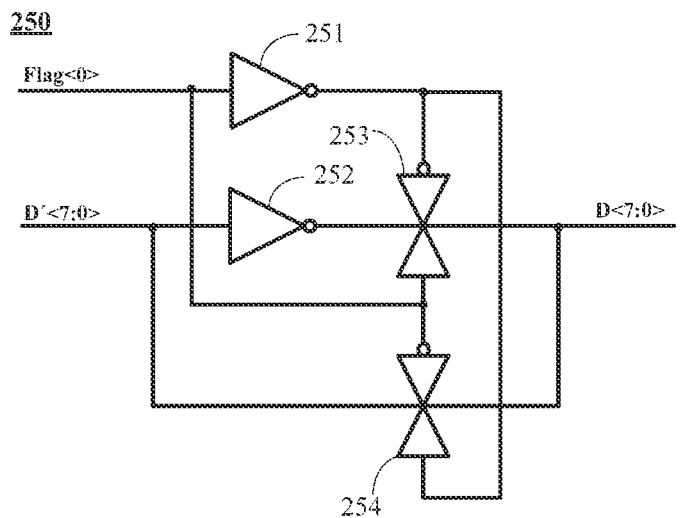
FIG. 8 schematically shows a block diagram of a data receiving unit according to an embodiment of the present application.

In one embodiment, the data receiving module 25 may include a plurality of data receiving units 250, where each data receiving unit 250 is used to process one bit of Flag data and a set of global bus data. For example, there may be 16 data receiving units 250, corresponding to respective 16 sets of global bus data and one bit of Flag data. FIG. 8 shows an implementation of the data receiving unit 250.

As shown in FIG. 8, the data receiving unit 250 includes a fourth inverter 251, a fifth inverter 252, a third transmission gate 253, and a fourth transmission gate 254.

The input end of the fourth inverter 251 receives the Flag data through the Flag signal line. The input end of the fifth inverter 252 receives the global bus data through the global bus. The input end of the third transmission gate 253 is coupled to the output end of the fifth inverter 252. The output end of the third transmission gate 253 is coupled to the memory bank 26 for outputting data to be written into the memory bank 26. The inverted control end of the third transmission gate 253 (the upper control end shown in FIG. 8) is coupled to the output end of the fourth inverter 251. The positive control end of the third transmission gate 253 receives the Flag data through the Flag signal line. The input end of the fourth transmission gate 254 receives the global bus data through the global bus. The output end of the fourth transmission gate 254 is coupled to the memory bank 26 for outputting data to be written into the memory bank 26. The inverted control end (the upper control end shown in FIG. 8) of the fourth transmission gate 254 receives Flag data through the Flag signal line, and the positive control end (the lower control end shown in FIG. 8) of the fourth transmission gate 254 is coupled to the output end of the fourth inverter 251.

Take Flag<0> and global bus data D'<7:0> as an example, as shown in FIG. 8, when Flag=1, written data D<7:0> is the flipped data of the global bus data D'<7:0>. Otherwise when Flag=0, the written data D<7:0> is just the global bus data D'<7:0>, that is, D<7:0>=D'<7:0>.

It should be noted that one set of the fifth inverter 252, third transmission gate 253, and fourth transmission gate 254 are used to process one bit of global bus data and output one bit of corresponding written data. In other words, corresponding to 8-bit global bus data D'<7:0>, there should also be eight sets of the fifth inverter 252, the third transmission gate 253, and the fourth transmission gate 254, thus then outputting the 8-bit written data D<7:0>.

According to the semiconductor memory 20 of this embodiment, in the process of writing data (DQ<7:0>=<11111111>; DQ<15:8>=<11111111>) to the semiconductor memory 20, the global bus data is 256 bits, so if there is a need to flip a 256-bit global bus data, it will turn out that only the 32-bit Flag data will be flipped, so that the IDD4W will be greatly compressed.

The semiconductor memory 20 of this embodiment may further include other structures such as a sense amplifier, a precharge circuit, etc. in practical applications, which are all existing technologies and so are not repeatedly detailed in this embodiment for brevity.

Figure 9:
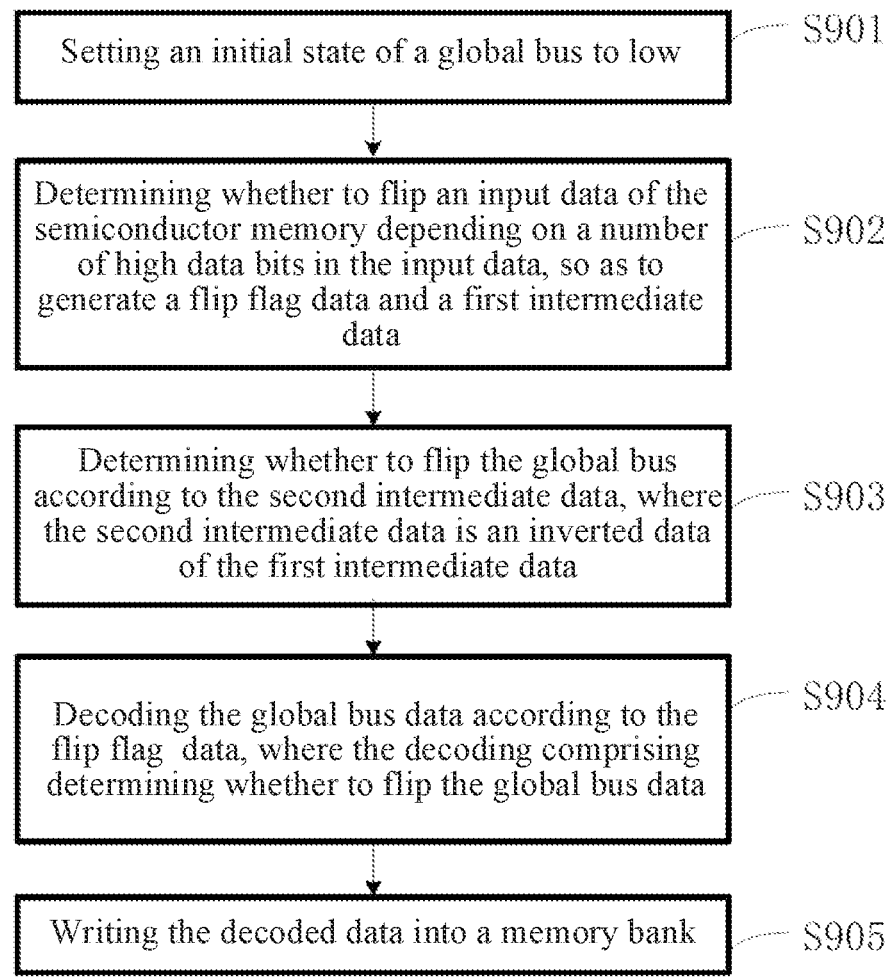
FIG. 9 schematically shows a flowchart of a write operation method according to an embodiment of the present application.

FIG. 9 schematically shows a flowchart of a write operation method according to an embodiment of the present application. This writing operation method can be applied to the semiconductor memory 20 described above. As shown in FIG. 9, the write operation method may include the following operations:

S901: setting an initial state of a global bus to low;

S902: determining whether to flip an input data based on the number of high data bits in the input data of the semiconductor memory, so as to generate a flip flag data and a first intermediate data;

S903: determining whether to flip the global bus according to the second intermediate data, where the second intermediate data is an inverted data of the first intermediate data;

S904: decoding the global bus data according to the flip flag data, where the decoding includes determining whether to flip the global bus data; and S905: writing the decoded data into the memory bank.

In one embodiment, operation S902 may include: performing serial-to-parallel conversion on the first input data of the DQ port to generate the second input data; and determining whether or not to flip the second input data according to the number of high data bits in the second input data, so as to generate the flip flag data and the first intermediate data.

In one embodiment, the operation of determining whether or not to flip the second input data according to the number of high data bits in the second input data, so as to generate the flip flag data and the first intermediate data may include: dividing the second input data into M sets, where each set of second input data has N bits; in the case where the number of high data bits in one input set of second input data is greater than N/2, outputting the flipped data of the set of second input data as the corresponding set of first intermediate data, and setting the data bit in the flip flag data corresponding to the set of second input data to high; and in the case where the number of high data bits in one input set of second input data is less than or equal to N/2, outputting the set of second input data as the corresponding set of first intermediate data, and setting the data bit in the flip flag data corresponding to the set of second input data to low.

The write operation circuit provided by this embodiment of the present application can be applied to a semiconductor memory with a global bus transfer structure of the precharge pull-down type, which can reduce the number of internal global bus flips before data is written into the memory block, thus greatly compressing the current and reducing the power consumption.

As used herein, references to the terms "one embodiment", "some embodiments", "examples", "specific examples", or "some examples" etc. are intended to mean that specific features, structures, materials, or characteristics described in connection with this embodiment or example are included in at least one embodiment or example of the present application. Furthermore, the described specific features, structures, materials or characteristics can be combined in any one or more embodiments or examples in a suitable manner. In addition, those having ordinary skill in the art may be able to combine the different embodiments or examples and the features of the different embodiments or examples described in this specification, in the premise that no contradiction or conflict is present.

Furthermore, the described features, structures or characteristics may be combined in one or more embodiments in any suitable manner. However, those having ordinary skill in the art will be able to realize that the technical solutions of the present application can be practiced without the presence of one or more of the specific details, or other methods, components, materials, devices, steps, etc. can be used. In other cases, well-known structures, methods, devices, implementations, materials, or operations are not shown or described in detail to avoid obscuring various aspects of the present application.

As used herein, terms "first", "second", or the like are merely used for illustrative purposes, and shall not be construed as indicating relative importance or implicitly indicating the number of technical features specified. Thus, the features defined by "first" and "second" may explicitly or implicitly include one or more of such features. As used herein, terms "multiple" or "a plurality of" means two or more, unless otherwise specifically defined.

It should be noted that although the various steps of the method in this application are described in a specific order shown in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc. The above-mentioned drawings are merely schematic illustrations of the processing included in the method according to the exemplary embodiments of the present application, and are not intended for limitation. It is readily understood that the processings shown in the above drawings does not indicate or limit the time order of these processings. In addition, it is readily understood that these processes can be executed synchronously or asynchronously in multiple modules, for example.

Furthermore, although the spirit and principle of this application have been described with reference to several specific embodiments, it should be understood that this application will not be limited to the disclosed specific embodiments, and the division of various aspects does not mean that the features in these aspects cannot be combined for benefit; in fact, this division is merely intended for the convenience of presentation. This application is intended to cover various modifications and equivalent arrangements included within the spirit and scope of the appended claims.

The foregoing merely depicts some specific implementations of this application, but the scope of protection of this application will not be limited thereto. Any person familiar with the technical field will be able to easily think of various changes or substitutions within the technical scope disclosed in this application, and these should all be covered by the scope of protection of this application. Therefore, the scope of protection of this application should be subject to the scope of protection of the appended claims.

What is claimed is:

1. A write operation circuit applied to a semiconductor memory, comprising:
   a data determination module, configured to determine whether to flip an input data of the semiconductor memory depending on a number of high data bits in the input data to generate a flip flag data and a first intermediate data;
   a data buffer module, comprising a plurality of PMOS transistors and a plurality of first inverters, wherein a gate of each of the plurality of PMOS transistors is coupled to the data determination module through a respective first inverter for receiving a second intermediate data, and a drain of each of the plurality of PMOS transistors is coupled to a global bus, wherein the data buffer module is configured to determine whether to flip a global bus data according to the second intermediate data, and the second intermediate data is an inverted data of the first intermediate data;
   a data receiving module coupled to a memory bank, wherein the data receiving module is configured to receive the global bus data on the global bus, receive the flip flag data through a flip flag signal line, decode the global bus data according to the flip flag data, and write a decoded data into the memory bank of the semiconductor memory, wherein the decoding comprises determining whether to flip the global bus data; and
   a precharge module, coupled to a precharge signal line and configured to set an initial state of the global bus data to low.

2. The write operation circuit of claim 1, further comprising a serial-to-parallel conversion circuit coupled between a Data Queue (DQ) port of the semiconductor memory and the data determination module, and configured to perform serial-to-parallel conversion on a first input data of the DQ port to generate a second input data; wherein the data determination module is configured for determining whether to flip the second input data depending on a number of high data bits in the second input data to generate the flip flag data and the first intermediate data.

3. The write operation circuit of claim 2, wherein the second input data is divided into a number of M sets, the flip flag data comprises a number of M bits, and the M-bits flip flag data has an one-to-one correspondence relationship with the M sets of second input data, wherein each set of the M sets of second input data comprises a number of N bits, and M and N are integers greater than 1;
   when the number of high data bits in each set of second input data is greater than N/2, the data determination module is configured for outputting a flipped data of the set of second input data as a corresponding set of first intermediate data, and setting a data bit in the flip flag data corresponding to the set of second input data to high;
   when the number of high data bits in each set of second input data is less than or equal to N/2, the data determination module is configured for outputting the set of second input data as the corresponding set of first intermediate data, and setting the data bit in the flip flag data corresponding to the set of second input data to low.

4. The write operation circuit of claim 2, wherein the data determination module comprises:
   a data determination unit, comprising an input end coupled to the serial-to-parallel conversion circuit and an output end coupled to the flip flag signal line, wherein the data determination unit is configured for setting the flip flag data to high when the number of high data bits in the second input data is greater than a preset value, and setting the flip flag data to low when the number of high data bits in the second input data is less than or equal to the preset value; and
   a data selector, comprising an input end coupled to the data determination unit for receiving the second input data through the data determination unit and receiving the flip flag data through the flip flag signal line, and an output end coupled to an input end of the first inverter, wherein the data selector is configured for outputting the flipped data of the second input data as the first intermediate data when the flip flag data is high, and outputting the original second input data as the first intermediate data when the flip flag data is low.

5. The write operation circuit of claim 4, wherein the data selector comprises a plurality of data selection units, each of the plurality of data selection units comprising:
   a second inverter, comprising an input end configured to receive the flip flag data through the flip flag signal line;
   a third inverter, comprising an input end coupled to the data determination unit for receiving the second input data from the data determination unit;
   a first transmission gate, comprising an input end coupled to an output end of the third inverter, an output end coupled to an input end of the respective first inverterand configured for outputting the first intermediate data, an inverted control end coupled to an output end of the second inverter, and a positive control end configured to receive the flip flag data through the flip flag signal line; and
   a second transmission gate, comprising an input end coupled to the data determination unit for receiving the second input data from the data determination unit, an output end coupled to the input end of the first inverter for outputting the first intermediate data, an inverted control end configured to receive the flip flag data through the flip flag signal line, and a positive control end coupled to the output end of the second inverter.

6. The write operation circuit of claim 3, wherein the global bus data comprises a number of M sets of global bus data, and the M-bits flip flag data has an one-to-one correspondence with the M sets of global bus data, and wherein the data receiving module comprises a number of M data receiving units coupled to the respective memory banks, wherein each of the M data receiving units is configured for decoding a respective set of global bus data according to a respective bit of the flip flag data.

7. The write operation circuit of claim 6, wherein each of the M data selection units comprises:
   a fourth inverter, comprising an input end configured to receive the flip flag data through the flip flag signal line;
   a fifth inverter, comprising an input end configured to receive the global bus data through the global bus;
   a third transmission gate, comprising an input end coupled to an output end of the fifth inverter, an output end coupled to the respective memory bankand configured for outputting the decoded data to the memory bank, an inverted control end coupled to an output end of the fourth inverter, and a positive control end configured to receive the flip flag data through the flip flag signal line; and
   a fourth transmission gate, comprising an input end configured to receive the global bus data through the global bus, an output end coupled to the respective memory bankand configured to output the decoded data to the respective memory bank, an inverted control end configured to receive the flip flag data through the flip flag signal line, and a positive control end coupled to an output end of the fourth inverter.

8. The write operation circuit of claim 1, wherein the precharge module comprises a plurality of NMOS transistors and a plurality of hold circuits, where a gate of each of the plurality of NMOS transistor is coupled to a precharge signal line, a drain of the NMOS transistor is coupled to the global bus, and input and output ends of each of the plurality of hold circuits are coupled to the global bus.

9. A semiconductor memory, comprising a write operation circuit, wherein the write operation circuit comprises:
   a data determination module, configured to determine whether to flip an input data of the semiconductor memory depending on a number of high data bits in the input data to generate a flip flag data and a first intermediate data;
   a data buffer module, comprising a plurality of PMOS transistors and a plurality of first inverters, wherein a gate of each of the plurality of PMOS transistors is coupled to the data determination module through a respective first inverter for receiving a second intermediate data, and a drain of each of the plurality of PMOS transistors is coupled to a global bus; wherein the data buffer module is configured to determine whether to flip a global bus data according to the second intermediate data, wherein the second intermediate data is an inverted data of the first intermediate data;
   a data receiving module coupled to a memory bank, wherein the data receiving module is configured to receive the global bus data on the global bus, receive the flip flag data through the flip flag signal line, decode the global bus data according to the flip flag data, and write a decoded data into the memory bank of the semiconductor, wherein the decoding comprises determining whether to flip the global bus data; and
   a precharge module, coupled to a precharge signal line and configured to set an initial state of the global bus data to low.

10. A write operation method applied to a semiconductor memory, the write operation method comprising:
    setting an initial state of a global bus data to low;
    determining whether to flip an input data of the semiconductor memory depending on a number of high data bits in the input data to generate a flip flag data and a first intermediate data;
    determining whether to flip the global bus data according to a second intermediate data, wherein the second intermediate data is an inverted data of the first intermediate data;
    decoding the global bus data according to the flip flag data, wherein the decoding comprises determining whether to flip the global bus data; and
    writing the decoded data into a memory bank.

11. The write operation method of claim 10, wherein the determining whether to flip an input data of the semiconductor memory depending on a number of high data bits in the input data to generate a flip flag data and a first intermediate data comprises:
    performing serial-to-parallel conversion on a first input data of a Data Queue (DQ) port to generate a second input data; and
    determining whether to flip the second input data depending on a number of high data bits in the second input data to generate the flip flag data and the first intermediate data.

12. The write operation method of claim 11, wherein the determining whether to flip the second input data depending on a number of high data bits in the second input data to generate the flip flag data and the first intermediate data comprises:
    dividing the second input data into a number of M sets, each of which comprising a number of N bits, where M and N are integers greater than 1;
    when the number of high data bits in each set of the M sets of second input data is greater than N/2, outputting an inverted data of the set of second input data as a corresponding set of first intermediate data, and setting a data bit in the flip flag data corresponding to the set of second input data to high; and
    when the number of high data bits in each set of the M sets of second input data is less than or equal to N/2, outputting the set of second input data as the corresponding set of first intermediate data, and setting the data bit in the flip flag data corresponding to the set of second input data to low.

* * * * *